United States Patent
Lu

(10) Patent No.: US 12,219,754 B2
(45) Date of Patent: Feb. 4, 2025

(54) MANUFACTURING METHOD OF SEMICONDUCTOR STRUCTURE AND STRUCTURE THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 464 days.

(21) Appl. No.: 17/660,478

(22) Filed: Apr. 25, 2022

(65) Prior Publication Data

US 2023/0046189 A1 Feb. 16, 2023

(30) Foreign Application Priority Data

Aug. 13, 2021 (CN) .......................... 202110931845.2

(51) Int. Cl.
*H10B 12/00* (2023.01)
*H01L 21/311* (2006.01)
*H01L 23/528* (2006.01)

(52) U.S. Cl.
CPC ...... *H10B 12/488* (2023.02); *H01L 21/31111* (2013.01); *H01L 23/528* (2013.01); *H10B 12/05* (2023.02); *H10B 12/053* (2023.02)

(58) Field of Classification Search
CPC .... H10B 12/053; H10B 12/34; H10B 12/488; H10B 12/05; H01L 21/76224; H01L 21/31111; H01L 23/528
See application file for complete search history.

(56) References Cited

U.S. PATENT DOCUMENTS

| | | | |
|---|---|---|---|
| 9,985,034 B2* | 5/2018 | Yoon | H10B 12/053 |
| 10,109,738 B2 | 10/2018 | Kim et al. | |
| 11,056,175 B1 | 7/2021 | Ikeda | |
| 2015/0194438 A1 | 7/2015 | Kim | |
| 2023/0048610 A1* | 2/2023 | Lu | H10B 12/34 |

OTHER PUBLICATIONS

US office action in U.S. Appl. No. 17/661,065, mailed on Aug. 19, 2024.

\* cited by examiner

*Primary Examiner* — Jose R Diaz
(74) *Attorney, Agent, or Firm* — Syncoda LLC; Feng Ma

(57) ABSTRACT

Embodiments of the present application relate to the field of semiconductors, and provide a manufacturing method of a semiconductor structure and a structure thereof. The method of manufacturing a semiconductor structure includes: providing a substrate, active regions and an isolation structure; patterning the active regions and the isolation structure to form a word line trench, sidewalls of the word line trench exposing the active regions and the isolation structure; performing corner rounding at least once on the active regions and the isolation structure exposed by the sidewalls of the word line trench, such that a first height difference is formed between remaining active regions and the isolation structure, wherein the corner rounding includes: etching the isolation structure exposed by the sidewalls of the word line trench, such that a first thickness of the active regions are exposed by the isolation structure.

14 Claims, 5 Drawing Sheets

MANUFACTURING METHOD OF SEMICONDUCTOR STRUCTURE AND STRUCTURE THEREOF

CROSS-REFERENCE TO RELATED APPLICATION

This application claims the priority of Chinese Patent Application No. 202110931845.2 submitted to the Chinese Intellectual Property Office on Aug. 13, 2021, the disclosure of which is incorporated herein in its entirety by reference.

TECHNICAL FIELD

Embodiments of the present application relate to the field of semiconductors, and in particular to a manufacturing method of a semiconductor structure and a structure thereof.

BACKGROUND

The memory is widely applied to various electronic products as a device for storing information in modern information technology. The memory can be classified into an internal memory and an external memory according to whether it can be directly read by a central processor. The internal memory can further be classified into a dynamic random access memory (DRAM) and a static random access memory (SRAM), etc.

A memory usually includes a capacitor and a transistor connected to the capacitor. An active region, a drain region and a gate are formed in the transistor. The gate is configured to control the flow of current between the active region and the drain region, and is connected to a word line (WL).

SUMMARY

According to an aspect, an embodiment of the present application provides a method of manufacturing a semiconductor structure, including: providing a substrate, the substrate including active regions spaced arranged from each other and an isolation structure located between the active regions; patterning the active regions and the isolation structure to form a WL trench, the WL trench extending along a first direction, and sidewalls of the WL trench exposing the active regions and the isolation structure; performing corner rounding at least once on the active regions and the isolation structure exposed by the sidewalls of the WL trench, such that a first height difference is formed between remaining active regions and the isolation structure in a second direction, wherein the second direction is parallel to the substrate and perpendicular to the first direction, and the corner rounding includes: etching the isolation structure exposed by the sidewalls of the WL trench, such that a first thickness of the active regions are exposed by the isolation structure in the second direction; performing oxidation on the exposed active regions to convert a second thickness of active regions into oxide layers, the oxide layers each having stepped orthographic projection on a surface of the substrate; and removing the oxide layers; and after forming the first height difference, forming a WL which filling the WL trench.

According to another aspect, an embodiment of the present application further provides a semiconductor structure, the semiconductor structure is formed with the above method of manufacturing a semiconductor structure.

BRIEF DESCRIPTION OF THE DRAWINGS

One or more embodiments are exemplified by corresponding drawings, and these exemplified descriptions do not constitute a limitation on the embodiments. The drawings are not limited by scale unless otherwise specified.

DETAILED DESCRIPTION

An embodiment of the present application provides a method of manufacturing a semiconductor structure. By performing corner rounding on active regions and an isolation structure exposed by sidewalls of WL trench, a first height difference is formed between active regions and the isolation structure in a second direction. Therefore, the present application increases the contact area between the active regions and the WL and the flow area of the current, thereby helping the WL better control turn-on speeds of channels in the active regions, achieving the better conductivity of the WL and improving the working efficiency of the semiconductor structure.

Various embodiments of the present application are described in detail below with reference to the drawings. Those of ordinary skill in the art should understand that many technical details are proposed in each embodiment of the present application to help the reader better understand the present disclosure. However, even without these technical details and various changes and modifications made based on the following embodiments, the technical solutions claimed in the present application may still be realized.

Figure 12:
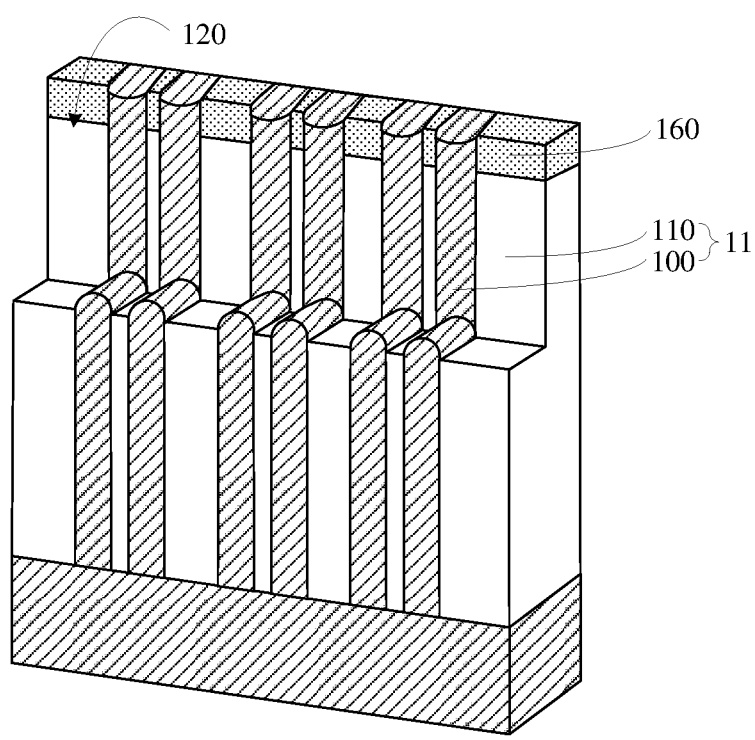
Figure 13:
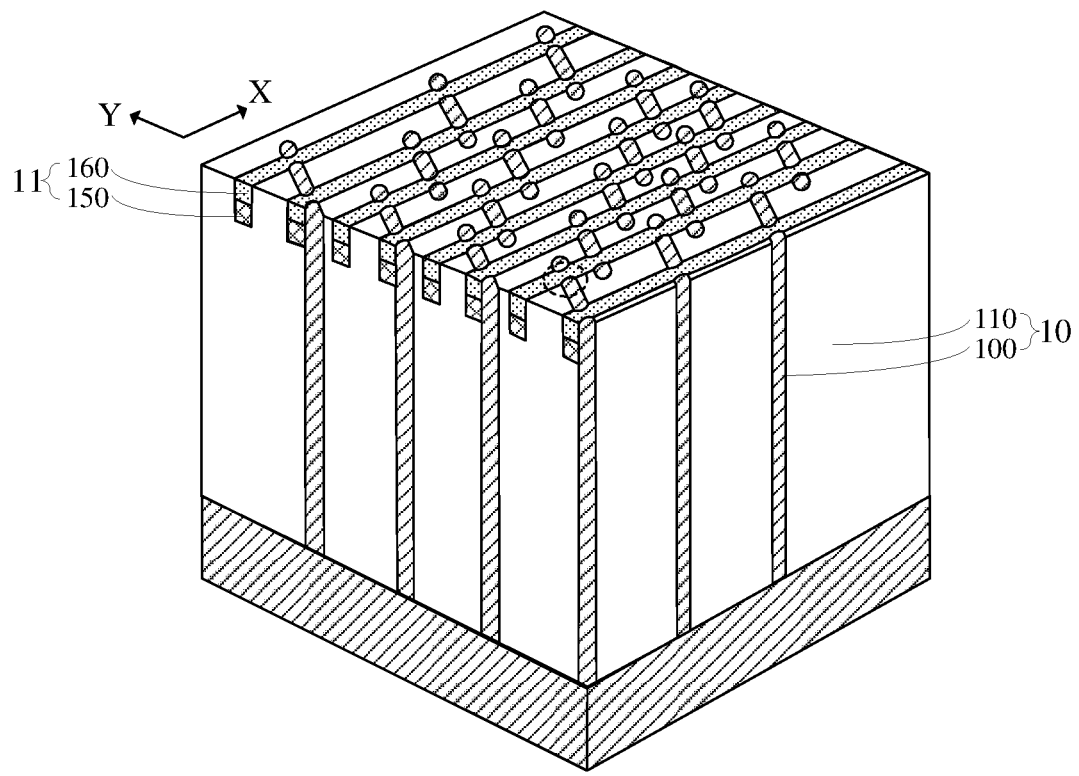
Figure 14:
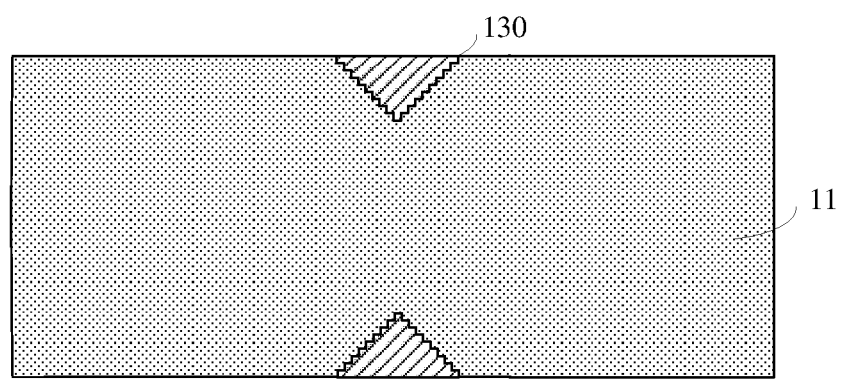
FIG. 14 is a partially enlarged schematic view of a semiconductor structure according to an embodiment of the present application.

FIG. 1 to FIG. 13 are schematic structural diagrams corresponding to various steps in a method of manufacturing a semiconductor structure according to embodiments of the present disclosure; and FIG. 14 is a partially enlarged schematic view in a circular dotted box of FIG. 13.

Figure 1:
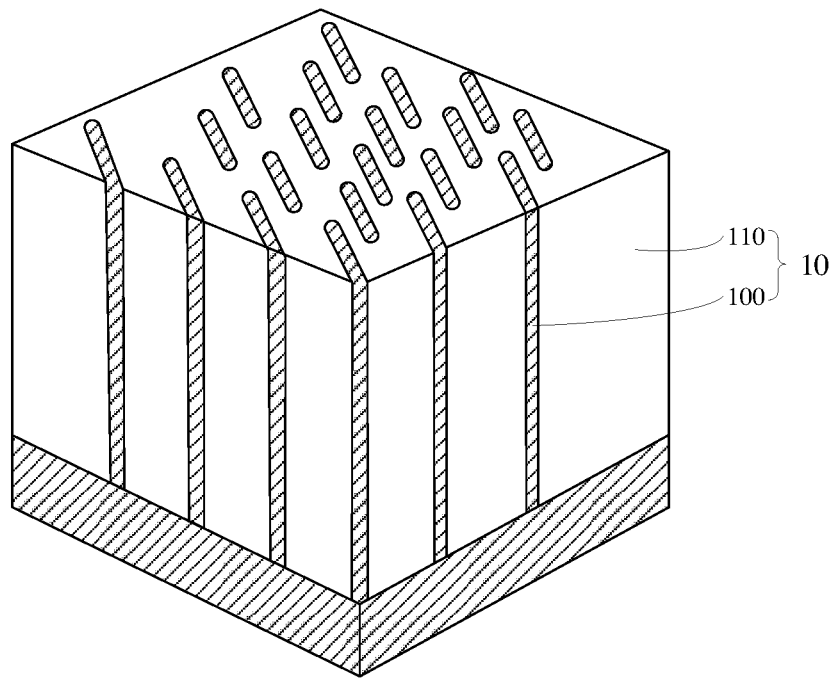
FIG. 1 to FIG. 13 are schematic structural diagrams corresponding to various steps in a method of manufacturing a semiconductor structure according to embodiments of the present disclosure.

Referring to FIG. 1, a substrate 10 is provided. The substrate 10 includes active regions 100 spaced arranged from each other and an isolation structure 110 located between the active regions 100.

In some embodiments, the active regions 100 may be made of silicon, germanium or gallium arsenide. It will be understood that the active regions 100 may be made of a corresponding material as required.

The isolation structure 110 may be made of silicon oxide, silicon nitride or silicon oxynitride. It will be understood that the isolation structure 110 may be made of a corresponding material as required.

In some embodiments, the active regions 100 are arranged in a regular array.

Figure 2:
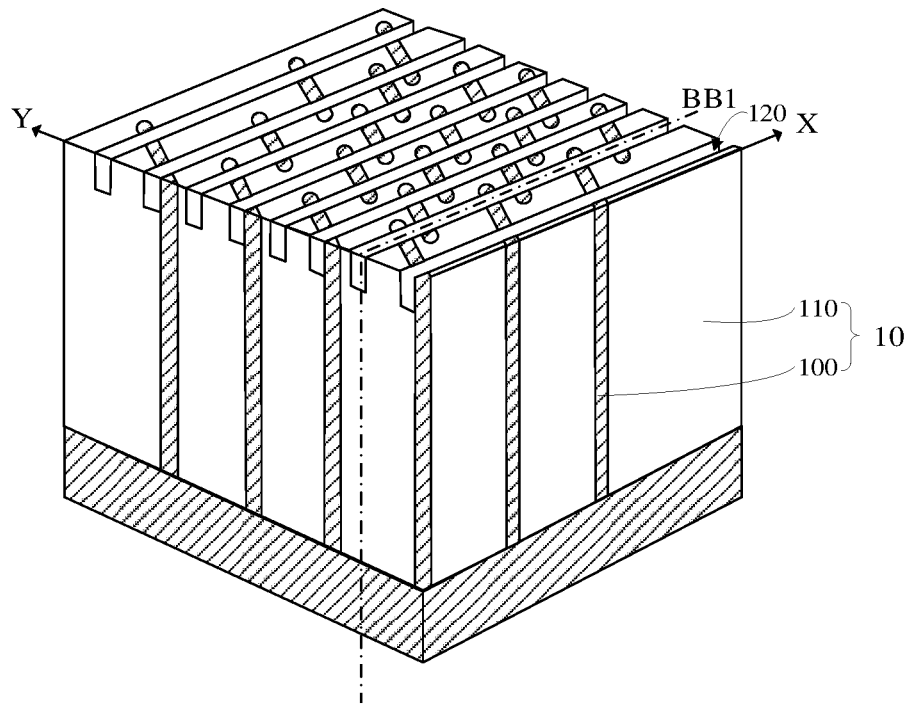
Figure 3:
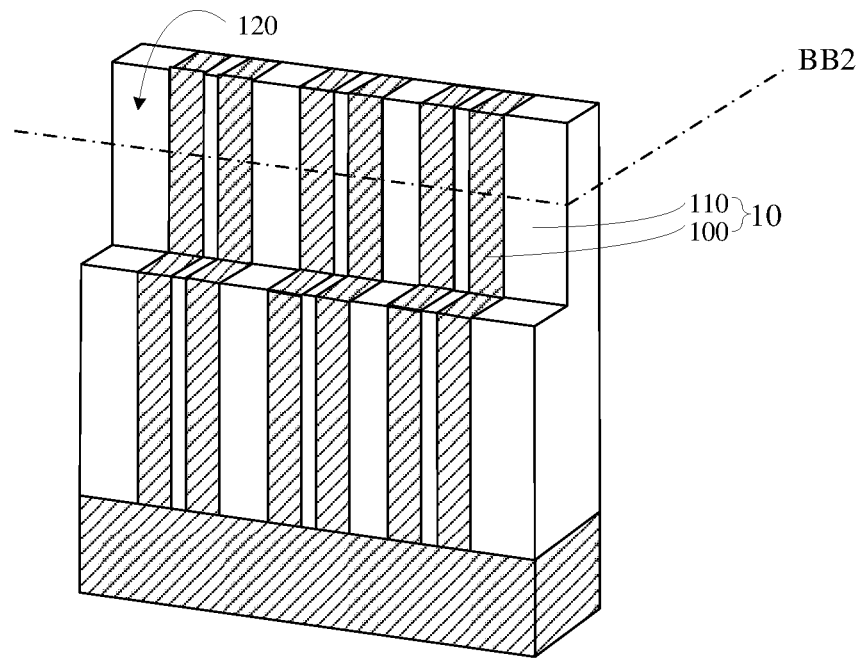

Referring to FIG. 2 and FIG. 3, FIG. 3 is a sectional view along a dotted line BB1 in FIG. 2. The active regions 100 and the isolation structure 110 are patterned to form a WL trench 120. The WL trench 120 extends along a first direction X. Sidewalls of the WL trench 120 expose the active regions 100 and the isolation structure 110.

The WL trench 120 lays foundations for subsequent formation of a WL. The WL trench 120 penetrates through the active regions 100 and the isolation structure 110 along the first direction X. The WL trench 120 is located at a certain thickness in the active regions 100 and the isolation structure 110.

A process for forming the WL trench 120 may include: a patterned mask layer is formed on the substrate 10; with the patterned mask layer as a mask, the active regions 100 and the isolation structure 110 are etched to form the WL trench 120; and the patterned mask layer is removed.

The WL trench 120 is formed with dry etching. In some embodiments, there are different etching rates for the active regions 100 and the isolation structure 110 in the dry etching, such that the WL trench 120 has an uneven bottom surface. For example, if an etching rate for the active regions 100 is greater than that for the isolation structure 110 in the etching, a top surface of the isolation structure 110 is higher than top surfaces of active regions 100 at the bottom of the WL trench 120. If an etching rate for the active regions 100 is less than that for the isolation structure 110 in the etching, the top surface of the isolation structure 110 is lower than the top surfaces of the active regions 100 at the bottom of the WL trench 120.

In some embodiments, the top surfaces of the active regions 100 may also be as high as the top surface of the isolation structure 110 at the bottom of the WL trench 120.

It will be understood that sides of the active regions 100 and sides of the isolation structure 110 exposed by the sidewalls of the WL trench 120 may be flush.

Referring to FIG. 4 to FIG. 11, corner rounding is performed at least once on the active regions 100 and the isolation structure 110 exposed by the sidewalls of the WL trench 120 (referring to FIG. 3), such that a first height difference is formed between remaining active regions 100 and isolation structure 110 in a second direction Y, the second direction Y being parallel to the substrate 10 and perpendicular to the first direction X. The corner rounding includes: the isolation structure 110 exposed by the sidewalls of the WL trench 120 is etched, such that a first thickness of the active regions 100 are exposed by the isolation structure 110 in the second direction Y; oxidation is performed on the exposed active regions 100 to convert a second thickness of active regions 100 into oxide layers 130, the oxide layers 130 each having stepped orthographic projection on a surface of the substrate 10 (referring to FIG. 2); and the oxide layers 130 are removed.

The corner rounding will be described below in detail with reference to the drawings.

Figure 4:
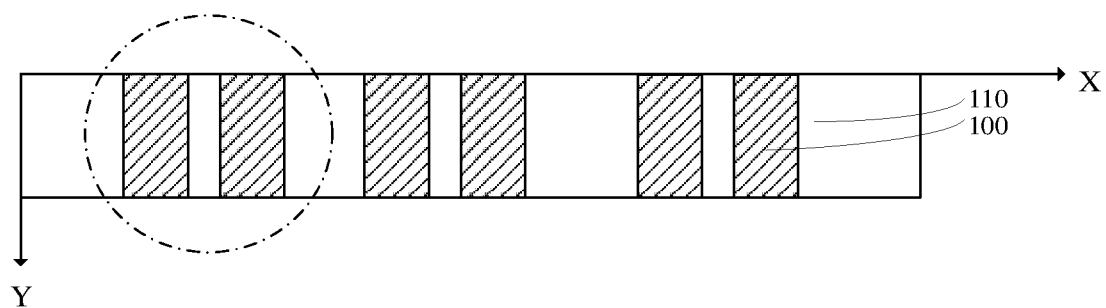
Figure 5:
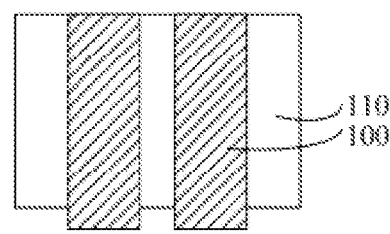

Referring to FIG. 4 and FIG. 5, FIG. 4 is a sectional view along a BB2 direction in FIG. 3, and FIG. 5 is a partially enlarged schematic view along a dotted line in FIG. 4. The isolation structure 110 exposed by the sidewalls of the WL trench 120 is etched, such that the first thickness of the active regions 100 are exposed by the isolation structure 110 in the second direction Y.

The first thickness of the active regions 100 are exposed by the isolation structure 110 in the second direction Y, which plays the foundations for subsequent oxidation of the active regions 100.

In some embodiments, while the isolation structure 110 exposed by the sidewalls of the WL trench 120 is etched, part of the isolation structure 110 on a part of a top surface of the substrate 10 is further etched.

In some embodiments, the first thickness may be in a range of 1-3 nm, such as 1.5 nm, 2 nm and 2.5 nm. The first thickness refers to a thickness parallel to the surface of the substrate 10 and perpendicular to the first direction X. The first thickness should not be too small or too large. If the first thickness is too small, the stepped oxide layers are hardly formed in subsequent oxidation. If the first thickness is too large, etched amounts of corresponding isolation structure 110 are large to affect electrical isolation performance of the remaining isolation structure 110. Therefore, with the first thickness in the range of 1-3 nm, the stepped oxide layers can be formed more easily, and the electrical isolation effect of the remaining isolation structure 110 can further be ensured.

In some embodiments, the isolation structure 110 exposed by the sidewalls of the WL trench 120 may be etched with wet etching because of high selectivity and desirable uniformity of the wet etching. When the active regions 100 are made of a silicon material, the wet etching causes less damage to the silicon material.

The isolation structure 110 may be made of silicon oxide. A hydrofluoric acid solution serves as an etching solution in the wet etching. The hydrofluoric acid solution may have a molar concentration of 40-60% such as 49%.

It will be understood that the etching solution in the wet etching may be adjusted according to the material of the isolation structure 110, thereby selecting the corresponding wet etching solvent.

In some embodiments, the wet etching lasts for 10-30 s, such as 15 s, 17 s or 20 s. It will be understood that the etching depth may be controlled by adjusting the mole of the wet etching solvent and the etching time.

Figure 6:
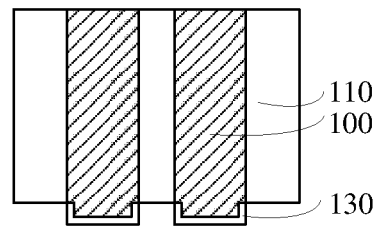

Referring to FIG. 6, the oxidation is performed on the exposed active regions 100 to convert the second thickness of the active regions 100 into the oxide layers 130. The oxide layers 130 each have stepped orthographic projection on the surface of the substrate 10 (referring to FIG. 1).

The oxide layers 130 each have the stepped orthographic projection on the surface of the substrate 10, which actually means that the oxide layers 130 each include an intermediate region and an edge region at a periphery of the intermediate region, and in a direction parallel to the second direction Y, the oxide layer 130 in the edge region is thicker than the oxide layer 130 in the intermediate region. By doing so, after the oxide layers are removed subsequently, remaining active regions 100 each have a step.

In some embodiments, during the oxidation, an oxidation rate for top surfaces of the exposed active regions 100 is the same as that for sidewalls of the exposed active regions 100. Within same time, oxide layers 130 formed on the sidewalls of the active regions 100 in a direction parallel to the first direction X are as thick as oxide layers 130 formed on the top surfaces of the active regions 100 in a direction parallel to the second direction Y. It is to be noted that the top surfaces of the active regions 100 refer to top surfaces of the active regions 100, exposed by the sidewalls of the WL trench 120 (referring to FIG. 3), in the direction parallel to the first direction X.

In some embodiments, oxide layers 130 formed in first corner rounding each have U-shaped orthographic projection on the surface of the substrate 10 (referring to FIG. 1). As shown in FIG. 6, the oxide layers 130 each are of a U shape.

In some embodiments, the oxidation includes: forming the oxide layers with ISSG.

In some embodiments, the oxidation may be thermal oxidation, because it can improve a generation rate of the oxide layers 130. In other embodiments, the active regions may further be oxidized with a chemical reagent.

Figure 7:
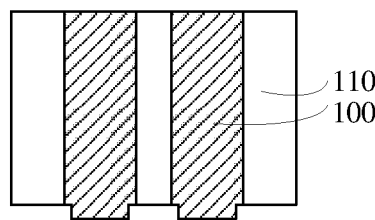

Referring to FIG. 7, the oxide layers 130 (referring to FIG. 6) are removed to expose unoxidized active regions 100.

In some embodiments, the oxide layers 130 (referring to FIG. 6) may be removed with wet etching. When the active regions 100 are made of the silicon material, the corresponding oxide layers 130 may be made of silicon oxide, and the reagent for removing the oxide layers 130 (referring to FIG. 6) may be the hydrofluoric acid solution having the molar concentration of 40-60%.

It will be understood that the corresponding wet etching reagent may be selected according to the material of the oxide layers 130 (referring to FIG. 6), or the oxide layers 130 (referring to FIG. 6) may be removed with dry etching and the like.

Figure 8:
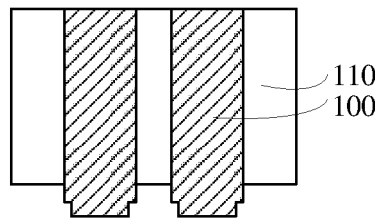
Figure 9:
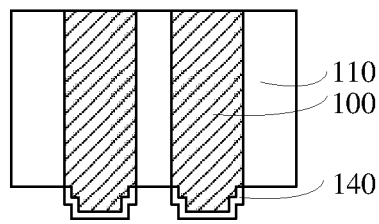
Figure 10:
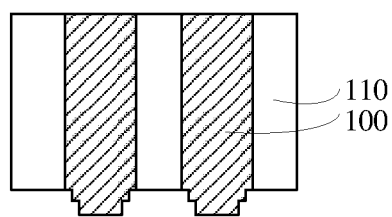

Referring to FIG. 8 to FIG. 10, next corner rounding is performed.

Specifically, referring to FIG. 8, part of the isolation structure 110 exposed by a sidewall of part of the WL trench 120 (referring to FIG. 3) is removed.

In some embodiments, in the direction parallel to the second direction Y, the isolation structure 110 is removed by a thickness of 1-3 nm in the corner rounding.

In some embodiments, the isolation structure 110 exposed by the sidewalls of the WL trench 120 may be etched with the wet etching by using the same wet etching reagent as the first corner rounding.

It will be understood that if the etching reagent and the etching time are the same as those in the first corner rounding, the removed thickness of the isolation structure 110 is the same as that of the isolation structure 110 in the first corner rounding. With the same etching reagent and etching time, the production is convenient, and the thickness removed each time for the isolation structure 110 can be controlled.

The thickness removed for the isolation structure 110 in the corner rounding is controlled by controlling the molar concentration of the wet etching reagent and the wet etching time.

In some embodiments, the removing the oxide layers 130 in previous corner rounding and the etching the isolation structure 110 exposed by the sidewalls of the WL trench 120 (referring to FIG. 3) in latter corner rounding are performed with a same process, namely, when the oxide layers 130 (referring to FIG. 6) and the isolation structure 110 are made of a same material such as silicon oxide, the isolation structure 110 may be etched while the oxide layers 130 (referring to FIG. 6) are etched. Corresponding, the thickness etched for the isolation structure 110 may be controlled by controlling the etching time.

Referring to FIG. 9, oxidation is performed on the exposed active regions 100 and the active regions 100 exposed in the previous corner rounding to form second oxide layers 140 on sidewalls of the active regions 100. In some embodiments, the oxidation method may be the same to reduce types of materials required in the oxidation.

The second oxide layers 140 each have stepped orthographic projection on the surface of the substrate 10 (referring to FIG. 1), with one step more than the oxide layers 130 (referring to FIG. 6) on the surfaces of the active regions 100.

It will be understood that, in some embodiments, an oxidation rate for a top surface of at least one of the active regions 100 exposed by the sidewalls of the WL trench 120 (referring to FIG. 3) is the same as that for sidewalls of the active regions 100. Within same time, the second oxide layers 140 formed on the top surfaces of the active regions 100 in the direction parallel to the second direction Y are as thick as the second oxide layers 140 formed on the sidewalls of the active regions 100 in the direction parallel to the first direction X. It is to be noted that the top surfaces of the active regions 100 refer to top surfaces of the active regions 100 exposed by the sidewalls of the WL trench 120 (referring to FIG. 3) in the direction parallel to the first direction X.

In some embodiments, the oxidation time in the first corner rounding is the same as that in the second corner rounding. In the direction perpendicular to the first direction X, the second oxide layers 140 on the top surfaces of the active regions 100 are as thick as the oxide layers 130 (referring to FIG. 6) on the top surfaces of the active regions 100.

It will be understood that the thickness of each of the second oxide layers 140 in the direction perpendicular to the first direction X may be controlled by controlling the oxidation method and the oxidation time.

Referring to FIG. 10, the second oxide layers 140 (referring to FIG. 9) are removed until the active regions 100 are exposed. It will be understood that the active regions 100 appears stepped after the second corner rounding. There is one step more formed by performing the corner rounding twice on the active regions 100 exposed by the sidewalls of the WL trench 120 (referring to FIG. 3).

It will be understood that whenever the corner rounding is performed again, there is one step more formed on projection of each of the active regions 100 exposed by the sidewalls of the WL trench 120 (referring to FIG. 3) on the surface of the substrate 10 (referring to FIG. 1), until height differences from the top surfaces of the active regions 100 exposed by the sidewalls of the WL trench 120 (referring to FIG. 3) to the isolation structure 110 exposed by the sidewalls of the WL trench 120 (referring to FIG. 3) reach the first height difference.

Figure 11:
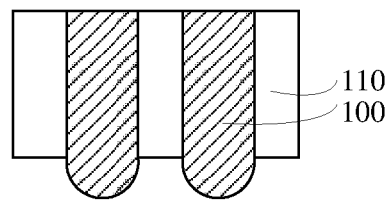

Referring to FIG. 11, the corner rounding is performed for 2-10 times. Upon completion of the corner rounding, the active regions 100 exposed by the sidewalls of the WL trench 120 (referring to FIG. 3) each are of an arc shape. It will be understood that the active regions 100 exposed by the sidewalls of the WL trench 120 (referring to FIG. 3) each are of the stepped shape actually, but appear arc-shaped because the active regions 100 are oxidized and removed by a small thickness in the first direction X and the second direction Y in each corner rounding.

It will be understood that the first height difference upon the corner rounding varies with the number of times that the corner rounding is performed.

In some embodiment, it may be proposed to only perform the corner rounding once obtain the semiconductor structure shown in FIG. 5.

Referring to FIG. 12, in some embodiments, the corner rounding is also performed on the active regions 100 on the bottom surface of the WL trench 120, while being performed on the active regions 100 exposed by the sidewalls of the WL trench 120. The active regions 100 exposed by the bottom surface of the WL trench 120 each are of an arc shape.

It will be understood that, in some embodiments, the active regions 100 and the isolation structure 110 exposed on the bottom surface of the WL trench 120 are flush prior to the corner rounding. After the corner rounding, the active regions 100 exposed by the bottom surface of the WL trench 120 and the active regions 100 exposed by the sidewalls of the WL trench 120 are the same in shape. In the second direction Y, the first height difference is formed between the remaining active regions 100 and isolation structure 110 on the bottom surface of the WL trench 120.

It will be understood that the active regions 100 exposed by the bottom surface of the WL trench 120 each have stepped orthographic projection on the sidewalls of the WL trench 120.

Referring to FIG. 13 and FIG. 14, FIG. 14 is a partially enlarged view along a dotted line in FIG. 13. After the first height difference is formed, a WL 11 filling the WL trench 120 (referring to FIG. 12) is formed.

In some embodiment, a process for forming the WL 11 includes: a conductive film filling the WL trench 120 (referring to FIG. 12) is formed; the conductive film is etched back to form a WL conductive layer 150; and a WL protective layer 160 is formed, the WL protective layer 160 being located on a surface of the WL conductive layer 150 and filling the WL trench 120 (referring to FIG. 12).

In some embodiments, the WL conductive layer 150 may be made of a conductive material such as tungsten or silver.

In some embodiments, there may further be no WL protective layer, namely the WL conductive layer is exposed on the surface of the substrate.

In some embodiments, the WL protective layer 160 may be made of silicon oxide or silicon nitride, and configured to protect the WL conductive layer 150. It can avoid oxidation of the WL conductive layer 150 due to contacts with the outside, and reduction in conductivity of the WL conductive layer 150 due to oxidation of a part of the WL conductive layer 150. In some embodiment, the WL protective layer 160 is further configured to avoid the contact between adjacent WL conductive layers 150 on the surface of the substrate 10.

In some embodiments, while the isolation structure 110 exposed by the sidewalls of the WL trench 120 (referring to FIG. 12) is etched, the top surface of the isolation structure 110 is further etched. The top surface of the remaining isolation structure 110 encloses a recessed region with adjacent active regions 100. While the WL protective layer 160 is formed, the WL protective layer 160 fills the recessed region.

The larger surface area between the stepped active regions 100 and the WL 11 is helpful for the WL 11 better control the conductivity of channel regions in the active regions 100.

According to the method of manufacturing a semiconductor structure provided by the present disclosure, after the active regions 100 and the isolation structure 110 are patterned to form the WL trench 120 extending along the first direction X, the corner rounding is performed at least once on the active regions 100 and the isolation structure 110 exposed by the sidewalls of the WL trench 120. The corner rounding includes: the isolation structure 110 exposed by the sidewalls of the WL trench 120 is etched, such that the first thickness of the active regions 100 are exposed by the isolation structure 110 in the second direction Y; the oxidation is performed on the exposed active regions 100 to convert the second thickness of the active regions 100 into the oxide layers 130; and the oxide layers 130 each have the stepped orthographic projection on the surface of the substrate 10, such that after the oxide layers 130 are removed, the first height difference is formed between the remaining active regions 100 and the isolation structure 110 in the second direction Y. Therefore, the present application increases the contact area between the active regions 100 and the WL 11 and the flow area of the current, thereby helping the WL 11 better control turn-on speeds of channels in the active regions 100, and improving the working efficiency of the semiconductor structure.

Accordingly, an embodiment of the present application further provides a semiconductor structure, which may be manufactured with the manufacturing method in the above embodiment. It is to be noted that the semiconductor structure in the embodiment of the present application is a semiconductor structure formed by a part or all of the above steps. Contents same as or corresponding to the above embodiment may refer to the corresponding descriptions in the above embodiment and will not be repeated hereinafter.

Referring to FIG. 13, the semiconductor structure includes: a substrate 10, the substrate 10 including active regions 100 spaced arranged from each other and an isolation structure 110 located between the active regions 100; and a WL 11, the WL 11 extending along a first direction X, and penetrating through the active regions 100 and the isolation structure 110 in the first direction X. In a second direction Y, a first height difference is formed between the active regions 100 and the isolation structure 110.

In some embodiments, the WL 11 includes a WL conductive layer 150, and a WL protective layer 160 on a top surface of the WL conductive layer 150.

In some embodiments, along a direction parallel to the second direction Y, a portion of a bottom surface of the WL 11 contacting each of the active regions 100 has stepped orthographic projection on a plane perpendicular to the surface of the substrate 10, to increase the contact area between the bottom surface of the WL conductive layer 150 and the active regions 100.

By providing the semiconductor structure having the first height difference between the active regions 100 and the isolation structure 110 on a section in the second direction Y, the present application increases the contact area between the active regions 100 and the WL 11 and the flow area of the current, thereby helping the WL 11 better control turn-on speed of channels in the active regions 100, and improving the working efficiency of the semiconductor structure.

Those of ordinary skill in the art should understand that the above implementations are specific embodiments for implementing the present application. In practical applications, various changes may be made to the above implementations in terms of form and details without departing from the spirit and scope of the present application. Those skilled in the art may make changes and modifications to the implementations without departing from the spirit and scope of the present application. Therefore, the protection scope of the present application should be subject to the scope defined by the claims.

The invention claimed is:

1. A method of manufacturing a semiconductor structure, comprising:

providing a substrate, the substrate comprising active regions spaced arranged from each other and an isolation structure located between the active regions;

patterning the active regions and the isolation structure to form a word line trench, the word line trench extending along a first direction, and sidewalls of the word line trench exposing the active regions and the isolation structure;

performing corner rounding at least once on the active regions and the isolation structure exposed by the sidewalls of the word line trench, such that a first height difference is formed between remaining active regions and the isolation structure in a second direction, wherein the second direction is parallel to the substrate and perpendicular to the first direction, and the corner rounding comprises:

etching the isolation structure exposed by the sidewalls of the word line trench, such that a first thickness of the active regions are exposed by the isolation structure in the second direction;

performing oxidation on surfaces of the exposed active regions to convert a second thickness of active regions into oxide layers, the oxide layers each having stepped orthographic projection on a surface of the substrate; and removing the oxide layers; and after forming the first height difference, forming a word line which filling the word line trench.

2. The method of manufacturing a semiconductor structure according to claim 1, wherein an oxidation rate for top surfaces of the exposed active regions is the same as an oxidation rate for sidewalls of the exposed active regions during the oxidation.

3. The method of manufacturing a semiconductor structure according to claim 1, wherein the oxidation comprises: forming the oxide layers with in-situ steam generation.

4. The method of manufacturing a semiconductor structure according to claim 1, wherein the oxidation is thermal oxidation.

5. The method of manufacturing a semiconductor structure according to claim 1, wherein the oxide layers formed in first corner rounding each have U-shaped orthographic projection on the surface of the substrate.

6. The method of manufacturing a semiconductor structure according to claim 1, wherein the corner rounding comprises: etching, with wet etching, the isolation structure exposed by the sidewalls of the word line trench.

7. The method of manufacturing a semiconductor structure according to claim 6, wherein the isolation structure is made of silicon oxide, and a hydrofluoric acid solution serves as an etching solution in the wet etching.

8. The method of manufacturing a semiconductor structure according to claim 6, wherein the wet etching lasts for 10-30 s.

9. The method of manufacturing a semiconductor structure according to claim 1, wherein the first thickness is in a range of 1-3 nm.

10. The method of manufacturing a semiconductor structure according to claim 1, wherein the removing the oxide layers in previous corner rounding and the etching the isolation structure exposed by the sidewalls of the word line trench, in latter corner rounding are performed with a same process.

11. The method of manufacturing a semiconductor structure according to claim 1, wherein the corner rounding is performed for 2-10 times.

12. The method of manufacturing a semiconductor structure according to claim 1, wherein forming a word line comprises:

forming a conductive film filling the word line trench;

etching back the conductive film, and forming a word line conductive layer; and forming a word line protective layer, the word line protective layer being located on a surface of the word line conductive layer and filling the word line trench.

13. The method of manufacturing a semiconductor structure according to claim 12, wherein when the isolation structure exposed by the sidewalls of the word line trench is etched, a top surface of the isolation structure is further etched, a top surface of a remaining isolation structure enclosing a recessed region with adjacent active regions; and when the word line protective layer is formed, the word line protective layer further fills the recessed region.

14. A semiconductor structure, the semiconductor structure is formed with the method of manufacturing a semiconductor structure according to claim 1.

* * * * *